(12) United States Patent
Kwon et al.

(10) Patent No.: US 7,449,069 B2
(45) Date of Patent: Nov. 11, 2008

(54) SLIT COATER HAVING APPARATUS FOR SUPPLYING A COATING SOLUTION

(75) Inventors: O Jun Kwon, Gyeongsangbuk-Do (KR); Kang Il Cho, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 47 days.

(21) Appl. No.: 11/211,257

(22) Filed: Aug. 19, 2005

(65) Prior Publication Data

US 2006/0141130 A1   Jun. 29, 2006

(30) Foreign Application Priority Data

Dec. 28, 2004   (KR) ............... 10-2004-0114395

(51) Int. Cl.
- *B05C 5/00* (2006.01)
- *B05C 3/02* (2006.01)
- *B05C 11/00* (2006.01)
- *B05B 13/02* (2006.01)
- *B05B 15/02* (2006.01)
- *B05B 1/02* (2006.01)

(52) U.S. Cl. ............... 118/305; 118/300; 118/302; 118/602; 118/410; 118/429; 239/568

(58) Field of Classification Search ............... 118/300, 118/305, 692–694, 712, 52, 612, 302, 602, 118/410, 401, 407, 429; 427/240, 424, 58, 427/64, 162; 239/568

See application file for complete search history.

(56) References Cited

U.S. PATENT DOCUMENTS

| | | | |
|---|---|---|---|
| 4,987,852 A * | 1/1991 | Sakai et al. ............... 118/603 |
| 5,167,837 A | 12/1992 | Snodgrass et al. | |
| 5,919,520 A * | 7/1999 | Tateyama et al. ........... 427/240 |
| 6,319,323 B1 | 11/2001 | Gibson et al. | |
| 6,475,282 B1 | 11/2002 | Snodgrass et al. | |

(Continued)

FOREIGN PATENT DOCUMENTS

JP    64-032680    2/1989

(Continued)

OTHER PUBLICATIONS

Office Action dated Sep. 26, 2006 for corresponding Korean Patent Application No. 10-2004-0114395.

*Primary Examiner*—Yewebdar T Tadesse
(74) *Attorney, Agent, or Firm*—Brinks Hofer Gilson & Lione

(57) ABSTRACT

A slit coater including an apparatus for supplying coating solution by a coating method using a slit nozzle, which is configured to minimize contamination of coating solution, utilizing a filtering function, and supplying a controlled amount of photosensitive solution to a slit nozzle. The slit coater further includes a table on which an object to be processed is mounted, a slit nozzle unit that applies coating solution onto a surface of the object to be processed, and a coating solution supply apparatus including a storage tank that stores the coating solution, a pump that supplies the coating solution stored in the storage tank to the slit nozzle unit, and a buffer tank that is in fluid communication with the pump and the storage tank.

17 Claims, 4 Drawing Sheets

U.S. PATENT DOCUMENTS

| | | |
|---|---|---|
| 6,488,041 B1 | 12/2002 | Kabbani et al. |
| 6,540,833 B1 | 4/2003 | Gibson et al. |
| 6,548,115 B1 | 4/2003 | Gibson et al. |
| 6,616,760 B2 * | 9/2003 | Kitano et al. ............... 118/302 |

FOREIGN PATENT DOCUMENTS

| | | |
|---|---|---|
| JP | 01-164474 | 6/1989 |
| JP | 07-080385 | 3/1995 |
| JP | 07-171479 | 7/1995 |
| JP | 07-185434 | 7/1995 |
| JP | 07-185437 | 7/1995 |
| JP | 07-326564 | 12/1995 |
| JP | 08-150359 | 6/1996 |
| JP | 08-155365 | 6/1996 |
| JP | 08-173878 | 7/1996 |
| JP | 09-131561 | 5/1997 |
| JP | 09-164357 | 6/1997 |
| JP | 09-192566 | 7/1997 |
| JP | 09-206652 | 8/1997 |
| JP | 09-237748 | 9/1997 |
| JP | 09-271705 | 10/1997 |
| JP | 09-330876 | 12/1997 |
| JP | 10-156255 | 6/1998 |
| JP | 10-308338 | 11/1998 |
| JP | 11-154641 | 6/1999 |
| JP | 11-274071 | 10/1999 |
| JP | 2000-135463 | 5/2000 |
| JP | 2000-167469 | 6/2000 |
| JP | 2000-288488 | 10/2000 |
| JP | 2001-103202 | 4/2001 |
| JP | 2001-310147 | 11/2001 |
| JP | 2001-310152 | 11/2001 |
| JP | 2002-015664 | 1/2002 |
| JP | 2002-066432 | 3/2002 |
| JP | 2002-066487 | 3/2002 |
| JP | 2002-113411 | 4/2002 |
| JP | 2002-204996 | 7/2002 |
| JP | 2002-282760 | 10/2002 |
| JP | 2002-346453 | 12/2002 |
| JP | 2003-093944 | 4/2003 |
| JP | 2003-236435 | 8/2003 |
| JP | 2003-245591 | 9/2003 |
| KP | 1019940000157 | 1/1994 |
| KP | 1019950030213 | 11/1995 |
| KP | 101996005857 | 2/1996 |
| KP | 101996021170 | 7/1996 |
| KP | 1019970701099 | 3/1997 |
| KP | 1019970051813 | 7/1997 |
| KP | 1019970063518 | 9/1997 |
| KP | 1019970072019 | 11/1997 |
| KP | 101998063704 | 10/1998 |
| KP | 1019980087322 | 12/1998 |
| KP | 101999029827 | 4/1999 |
| KP | 1020010006575 A | 1/2001 |
| KP | 1020010086065 | 7/2001 |
| KP | 1020020018973 A | 3/2002 |
| KP | 1020020018974 A | 3/2002 |
| KP | 1020020019406 A | 3/2002 |
| KP | 1020020028829 A | 4/2002 |
| KP | 1020020029323 A | 4/2002 |
| KP | 1020020077814 A | 10/2002 |
| KP | 1020020080440 | 10/2002 |
| KP | 1020030003114 A | 1/2003 |
| KP | 1020030011462 A | 2/2003 |
| KP | 1020030011463 A | 2/2003 |
| KP | 1020030045636 A | 6/2003 |
| WO | 2004-89960 | 10/2004 |

* cited by examiner

SLIT COATER HAVING APPARATUS FOR SUPPLYING A COATING SOLUTION

PRIORITY CLAIM

This application claims priority to Korean patent application No. 114395/2004 filed Dec. 28, 2004, the disclosure of which is incorporated by reference herein.

TECHNICAL FIELD

The present invention relates, generally, to a slit coater and, more particularly, to a slit coater capable of uniformly supplying a coating solution to a nozzle that applies a coating solution, such as a photosensitive solution, a development solution, or a color filter onto an object to be processed such as a glass substrate, a plastic substrate, a semiconductor wafer, or the like, of a flat panel display (FPD) device.

BACKGROUND

When a flat panel display device or a semiconductor device is fabricated, a process for depositing a thin film, a photolithography process for exposing a region selected in the thin film and an etching process for removing the thin film of the selected region are performed several times. Particularly, the photolithography process includes a coating process for forming a photosensitive film of a photosensitive solution such as a photoresist on a substrate or a wafer, and an exposing and developing process for patterning the photosensitive film by using a mask with a predetermined pattern.

In general, a spray coating method, a roll coating method, a spin coating method or the like is used in the coating process for forming a photosensitive film on a substrate and a wafer.

Because the spray coating method and the roll coating method are not suitable to achieve high precision in the uniformity of a coating film and the adjustment of a thickness of the film, the spin coating method is used for high-precision pattern formation.

A spin coater used in the spin coating method will now be described in detail with reference to accompanying drawings.

FIG. 1 is a sectional view which illustrates the structure of a general spin coater.

As shown, the spin coater includes a spin chuck 5 that is connected to a rotating shaft 6. A cover 7 surrounds the spin chuck 5 and can be opened and closed. A nozzle 4 is placed above the spin chuck 5 and moves into the cover 7 when the cover 7 is opened.

An object 10 to be processed and coated with a photosensitive film is mounted on the spin chuck 5, and a drain valve (not shown) for discharging photosensitive solution, such as photoresist, to the outside is installed at a lower portion of the cover 7.

In order to form a coating film on the predetermined object 10, first, the nozzle 4 of the spin coater having the aforementioned structure is lowered and sprays photosensitive solution onto a surface of the object 10, which has been placed on the spin chuck 5.

When the photosensitive solution is sprayed onto the object 10, the cover 7 is hermetically closed, a motor (M) is rotated, and the rotating shaft 6 connected thereto is rotated, thereby rotating the spin chuck 5 with the object 10 a certain number of times.

When the spin chuck 5 is rotated, the photosensitive solution on the surface of the object 10 is spread out by a centrifugal force, thereby applying the photosensitive solution over an entire surface of the object 10.

After the photosensitive solution is applied over the entire surface of the object 10, the applied photosensitive solution is hardened. Then, a predetermined pattern is formed on the surface of the object 10 through exposure and development using a photo mask or the like.

Although the spin coating method using the spin coater is suitable to coat a small object, such as a wafer with a photosensitive film, it is not suitable to coat a large and heavy substrate, such as a flat panel display device having a glass substrate for a liquid crystal display panel with a photosensitive film.

This is because it gets harder to rotate a substrate at a high speed as the substrate gets larger and heavier. Further, damage to the substrate can occur and much energy is consumed when the substrate is rotated at a high speed.

Also, the spin coating method is disadvantageous in that a large amount of photosensitive solution is wasted in comparison with the amount of photosensitive solution used in the photolithography process. In particular, a considerable amount of photosensitive solution is dispersed outside the spin chuck at the time of high-speed rotation, and is wasted. Substantially, the amount of wasted solution is much larger than the amount of solution used for coating, and the dispersed photosensitive solution may form particles that contaminate following thin film forming processes. The particles can also cause environmental pollution.

BRIEF SUMMARY

In accordance with the present invention there is provided a slit coater having an apparatus for supplying coating solution, including a table on which an object to be processed is mounted; a slit nozzle unit configured to apply a coating solution onto a surface of the object; and a coating solution supply apparatus including a storage tank configured to store the coating solution, a pump that supplies the coating solution stored in the storage tank to the slit nozzle unit, and a buffer tank in fluid communication with the pump and the storage tank, wherein the supply apparatus substantially uniformly maintains pressure of the pump and removes bubbles from the coating solution.

In another aspect, a method for fabricating an LCD device includes supplying a coating solution from a storage tank to a sealed buffer tank in fluid communication with a pump. A substantially uniform amount of coating solution is supplies at a substantially uniform pressure from the sealed buffer tank to a slit nozzle unit. The coating solution is applied onto a surface of an LCD substrate using the slit nozzle unit.

In yet another aspect, a method for fabricating an LCD device using a slit coater includes providing a table on which an LCD substrate is mounted and applying a coating solution onto the substrate using a slit nozzle. The coating solution is supplied to the slit nozzle by a coating solution supply apparatus that includes a storage tank configured to store the coating solution, a pump that supplies the coating solution stored in the storage tank to the slit nozzle unit, and a sealed buffer tank in fluid communication with the pump and the storage tank. The supply apparatus is configured to substantially uniformly maintain pump pressure and to remove air bubbles from the coating solution.

In still another aspect, method for coating a resist layer for fabricating an LCD device using a coating system includes providing a slit nozzle unit configured to apply a coating solution onto an LCD substrate, providing a coating solution storage tank, providing a coating solution supply system that includes a pump, and providing a sealed buffer tank in fluid communication with the pump and the storage tank. The coating solution supply system is configured to supply a substantially uniform amount of coating solution at a substantially uniform pressure from the buffer tank to the slit nozzle unit, and the coating solution is applied to the LCD substrate.

The foregoing and other features, aspects, and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings.

DETAILED DESCRIPTION

Reference will now be made in detail to the preferred embodiments of the present invention, examples of which are illustrated in the accompanying drawings.

In general, as mentioned above, a photolithography process is required in the field of semiconductor manufacture and the field of flat panel display device in order to pattern a thin film performing a specific function, for example, an insulation film, a metal thin film, a semiconductor thin film or the like, into a desired form. Here, photosensitive solution such as photoresist, which chemically reacts to light, is used in the photolithography process.

A photosensitive film having a uniform thickness should be formed on a substrate on which a thin film has been formed, so that a defect does not occur during the process. For example, if the photosensitive film has a thickness greater than a designated thickness, a portion of the thin film which should be etched is not etched, and if the photosensitive film has a thickness smaller than the designated thickness, the thin film is excessively etched. Also, the uniform application of the photosensitive solution is one of the most important issues as the substrate becomes larger due to an increase in size of the liquid crystal display panel of a liquid crystal display (LCD) device.

In accordance with an embodiment of the invention, a nozzle method in which a certain amount of photosensitive solution is applied by using a slit nozzle is employed in place of a related art spinner. A coating apparatus employing such a nozzle method is referred to as a spinless coater because a spinner is not used. Alternatively, the term "slit coater" is used because photosensitive solution is applied through a slit. The slit coater supplies the photosensitive solution through a nozzle having a slit shape with a length longer than its width, and applies the photosensitive solution onto a surface of a substrate in a plane form, which makes the slit coater suitable to apply the photosensitive solution to a large LCD device.

Figure 1:
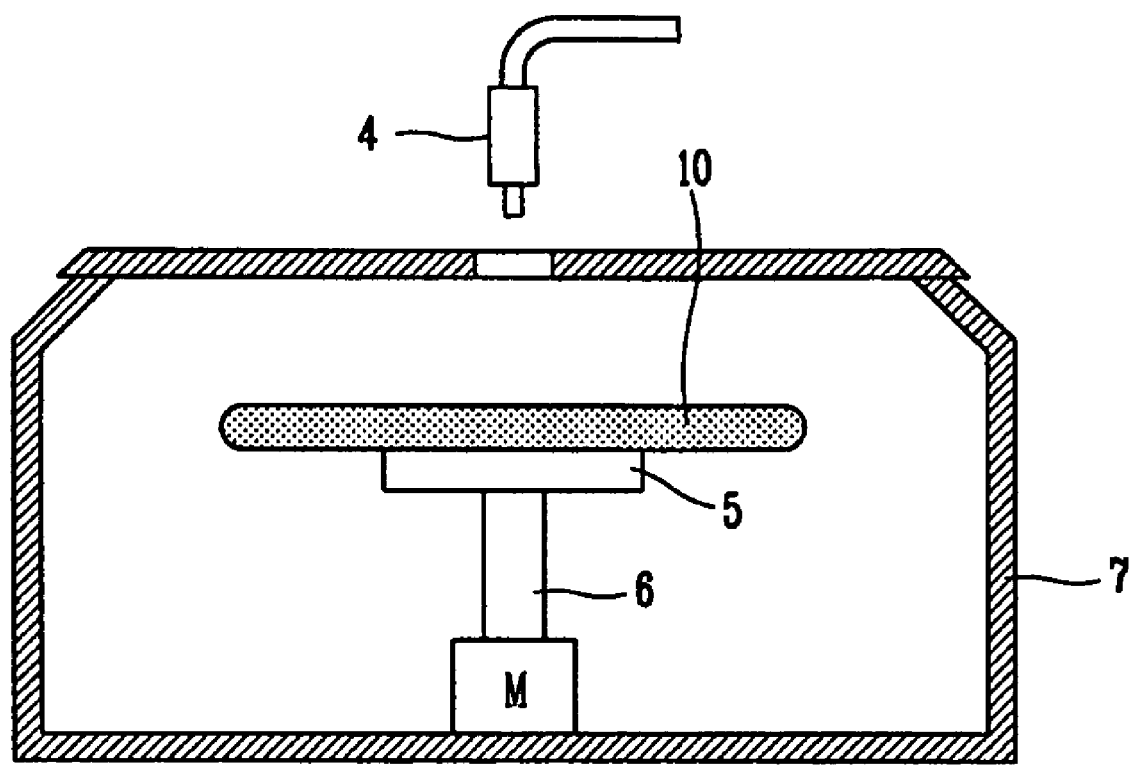
FIG. 1 is a sectional view which illustrates a structure of a related art spin coater.
Figure 2A:
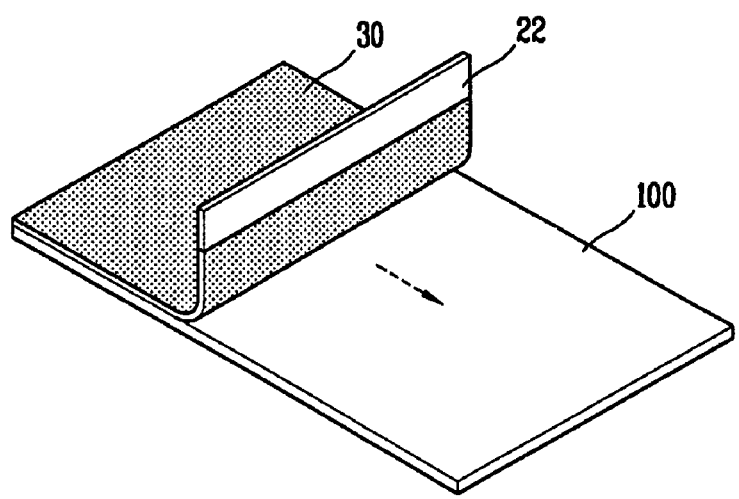
FIGS. 2A and 2B are perspective views which illustrate a slit coater and application of photosensitive solution by the slit coater in accordance with an embodiment of the invention.
Figure 2B:
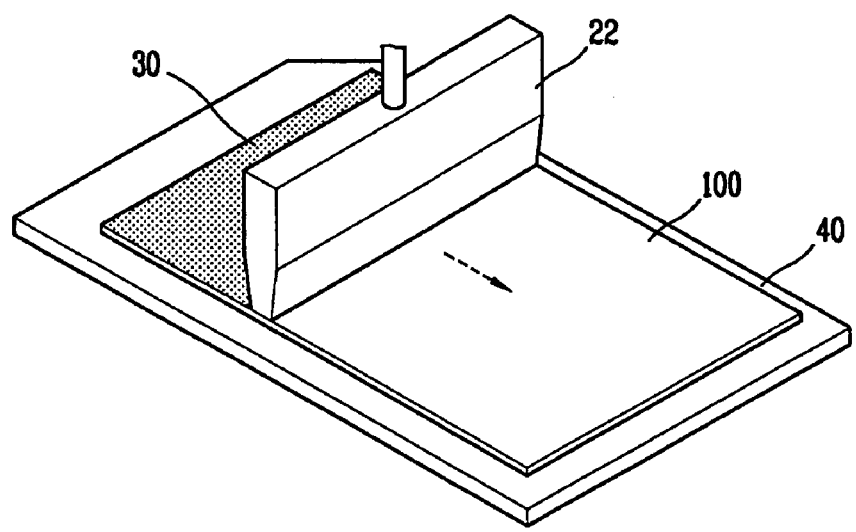

FIGS. 2A and 2B are exemplary views which illustrate a slit coater and the application of a photosensitive solution by the slit coater. In accordance with an embodiment of the invention, the slit coater is provided with a slit nozzle 22 having a narrow and long slit. Photosensitive solution 30 is supplied through the slit nozzle 22, thereby applying the photosensitive solution 30 on a surface of a substrate 100 in a plane form.

The slit coater is an apparatus that applies a predetermined amount of photosensitive solution 30 onto the substrate 100 or the like through a bar-shaped long slit nozzle 22. The slit coater applies a uniform amount of photosensitive solution 30 through a fine slit nozzle 22, moving from one side to the other side of the substrate 100 at a constant speed, thereby forming a uniform photosensitive film on the surface of the substrate 100.

Also, because the slit coater can apply the photosensitive solution 30 only to a desired surface of the substrate 100, the coating solution can be used without being wasted as compared to the aforementioned spin coater. In addition, because the slit coater can apply the coating solution in a plane form with a long width, it is suitable for a large substrate or a quadrangular substrate.

For reference, element 40 indicates a table on which the substrate 100 is mounted, and the arrow indicates a direction in which the photosensitive solution 30 is applied along a direction that the slit nozzle 22 moves.

The slit coater in accordance with the present invention is provided with an apparatus that supplies photosensitive solution to the nozzle of the slit coater, and this will now be described in detail with reference the accompanying drawing.

Figure 3:
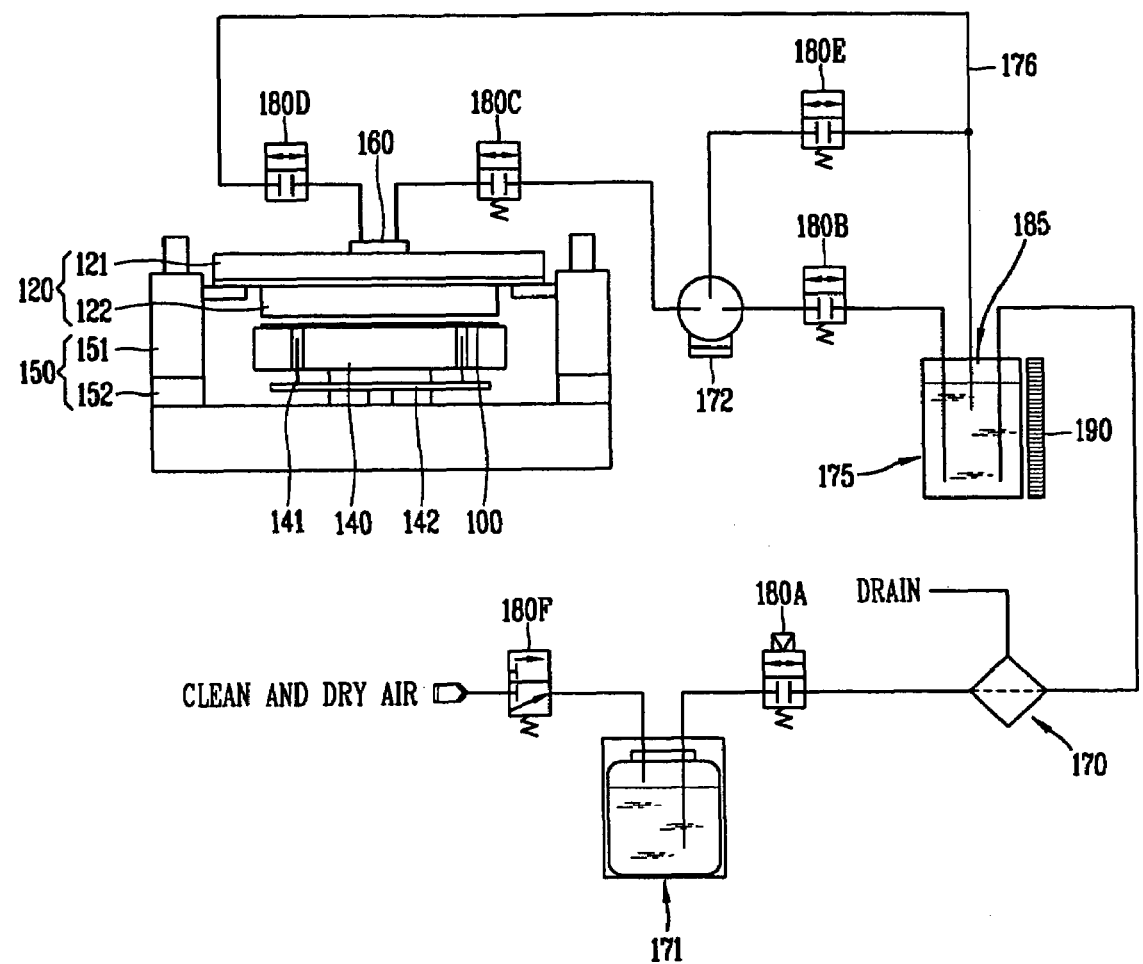
FIG. 3 is a schematic exemplary view which illustrates a slit coater having an apparatus for supplying photosensitive solution in accordance with a first embodiment of the present invention.

FIG. 3 is a schematic exemplary front view of a slit coater provided with the apparatus for supplying photosensitive solution in accordance with the first embodiment of the present invention.

As shown, the slit coater in accordance with the present embodiment includes a table 140 on which a substrate 100 is mounted, a slit nozzle unit 120 that applies coating solution, for example, photosensitive solution such as photoresist, onto the substrate 100, and a driving unit 150 that is installed at both ends of the slit nozzle unit 120 and moves the slit nozzle unit 120 at a constant speed.

The driving unit 150 includes a pair of Z-axial driving apparatuses 151 installed at both ends of the slit nozzle unit 120 and moving the slit nozzle unit 120 in a vertical direction, and a pair of Y-axial driving apparatuses 152 moving the slit nozzle unit 120 back and forth to allow the photosensitive solution to be uniformly applied on the surface of the substrate 100.

Here, each Y-axial driving apparatus 152 may include a motor (not shown) and a transfer unit (not shown) such as a transfer rail and a guide rail, and a non-contact type linear motor can be used as the motor.

An object 100 to be processed such as a glass substrate is mounted on the table 140, and a plurality of pins 141 for lifting up the substrate 100 from the table 140 are installed inside the table 140. The pins 141 are supported by a plate 142 placed under the table 140, and mounts or lifts the object 100 on or from the table 140 by action of the plate 142 that is, in turn, moved up and down by a driving unit (not shown) such as a motor.

Although not shown in the drawing, a preliminary discharge apparatus for applying a initial coating may be installed at one side of the table 140.

The slit nozzle unit 120 includes a slit type nozzle 122 that is placed above the substrate 100 and across the substrate 100 and has a length corresponding to a width of the substrate 100, and a head 121 to which the nozzle 122 is mounted.

Although not shown in detail, the nozzle 122 includes a nozzle body, an inlet and an outlet, wherein the nozzle body has a receiving space for storing a photosensitive solution therein, the inlet is formed at the nozzle body, and the outlet is formed at a surface of the nozzle body, which faces the substrate 100. Here, the outlet has a slit shape having a length longer than its width.

Also, the nozzle 122 applies the photosensitive solution, while moving from one side to the other side of the substrate 100 through the Y-axial driving apparatuses 152, thereby uniformly applying the photosensitive solution on the surface of the substrate 100. The photosensitive solution may also be applied by sliding the substrate 100 relative to the nozzle 122, which remains in a fixed position.

A bubble outlet 160 for removing bubbles within the nozzle 122 resides at an upper end of the head 121 of the slit nozzle unit 120.

The slit coater having such a structure further includes a supply apparatus for supplying photosensitive solution to the nozzle 122 of the slit nozzle unit 120, and a storage tank 171 for storing photosensitive solution. The supply apparatus also includes a supply line 176 through which the stored photosensitive solution is supplied to the slit nozzle unit 120, and a flow control unit such as a sensor 190. The supply apparatus further includes a pumping unit such as a pump 172 that provides the photosensitive solution to be sprayed by applying constant pressure to the photosensitive solution being supplied from the storage tank 171 to the slit nozzle unit 120.

The storage tank 171 stores coating solution such as a photosensitive solution, for example, a photoresist, development solution, a color filter, or the like, that is to be supplied to the slit nozzle unit 120. The storage take 171 may be attached to the driving unit 150.

A buffer tank 175 is installed between the pump 172 and the storage tank 171 in order to make the pressure of the pump 171 constant and remove bubbles. A level sensor 190 for measuring the amount of residual photosensitive solution is attached to the buffer tank 175.

In the illustrated arrangement, the level sensor 190 of the buffer tank 175 detects a shortage of the photosensitive solution and sends a signal to a control apparatus (not shown), and the control apparatus sends the signal to a sixth valve 180F to allow clean and dry air to be introduced to the storage tank 171, thereby introducing the photosensitive solution within the storage tank 171 into the buffer tank 175.

In the illustrated embodiment, the buffer tank 175 is placed at substantially the same height as the pump 172 so as to minimize pressure difference due to potential energy, and a hole, namely, an air passage 185 is made at one side of an upper end of the buffer tank 175, thereby always maintaining constant pressure of the buffer tank 175. By mounting an air filter at the air passage 185, contamination within the buffer tank 175 can be minimized.

The pressure generated by photosensitive solution introduced to the buffer tank 175 is eliminated by the air passage 185, so that the buffer tank 175 can be filled with the photosensitive solution. Here, in a state that a second valve 180B is opened and third and fifth valves 180C and 180E are closed, the photosensitive solution is drawn into the pump 172 from the buffer tank 172. Accordingly, the intake amount is not varied.

In a state that the second and fifth valves 180B and 180E are closed and the third valve 180C is opened for an initiation signal of a coating process, the photosensitive solution drawn into the pump 172 is discharged to the surface of the substrate 100 through the slit nozzle 122.

If air bubbles are formed in the pump 172, the fifth valve 180E is opened in while the third and second valves 180C and 180B are closed, thereby removing the bubbles and thusly minimizing variations in the discharge amount due to the bubbles. If the bubbles are formed in the slit nozzle 122, the fourth valve 180D is opened so that the bubbles can be discharged through the bubble outlet 160.

As the photosensitive solution is drawn into the pump 172 while atmospheric pressure is maintained, such that the internal pressure of the pump 172 can be constant every time the suction is performed, which allows the pump 172 to always draw a certain amount of photosensitive solution and thusly discharge a fixed amount of photosensitive solution.

A filter 170 for removing impurities from the photosensitive solution being supplied from the storage tank 171 is installed between the buffer tank 175 and the storage tank 171.

However, in the photosensitive supply apparatus in accordance with the first embodiment, because the buffer tank 175 is placed downstream of the filter 170 and the buffer tank 175 is always opened to be in the atmospheric state, an environment where the air is likely to come into contact with the photosensitive solution is provided, which can cause the photosensitive solution to be polluted and to form a gel.

Figure 4:
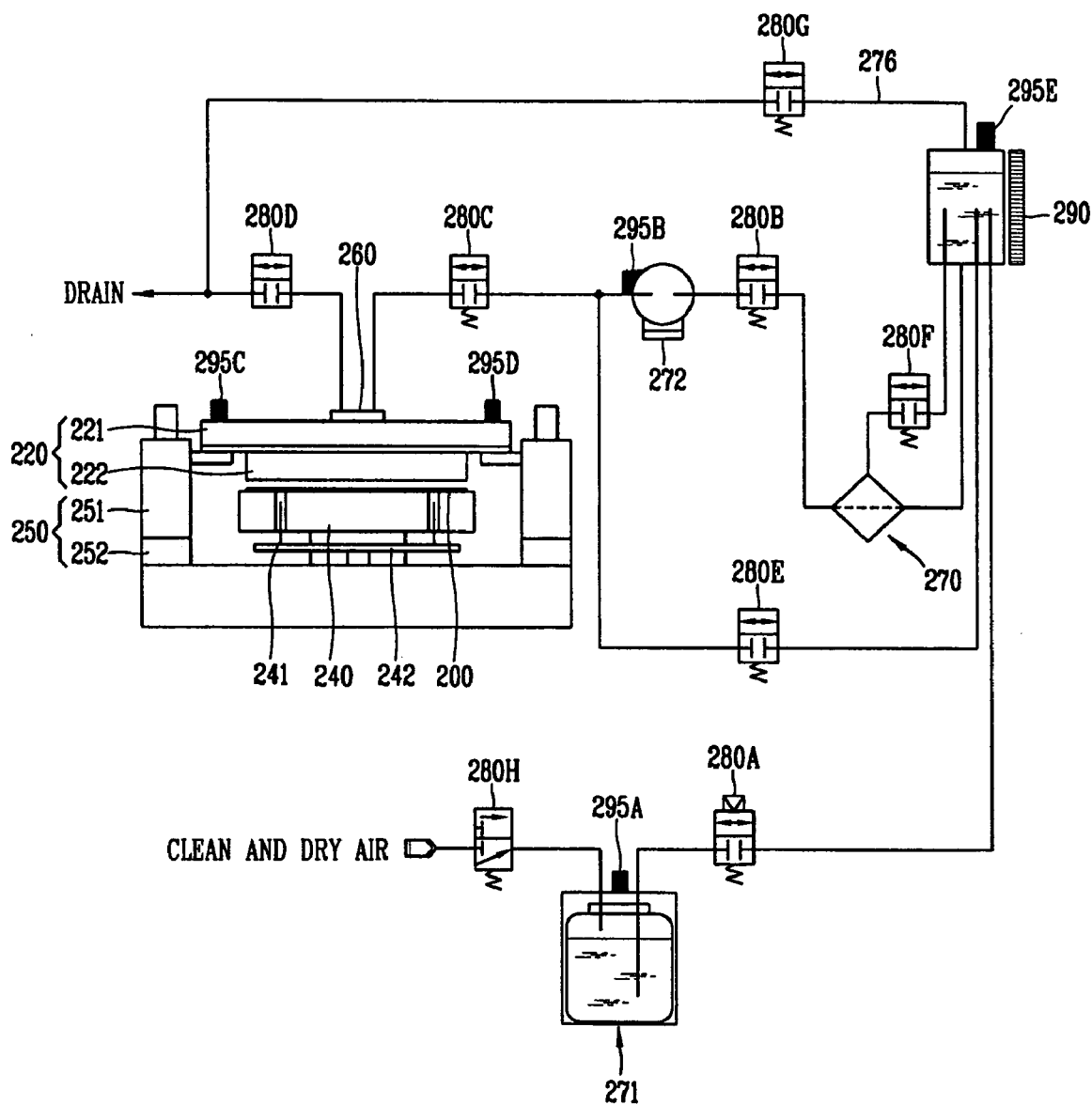
FIG. 4 is a schematic exemplary view which illustrates a slit coater having an apparatus for supplying photosensitive solution in accordance with a second embodiment of the present invention.

FIG. 4 is a schematic exemplary view which illustrates a slit coater having an apparatus for supplying photosensitive solution in accordance with the second embodiment.

The slit coater in accordance with the present embodiment has the same structure as that of the slit coater in accordance with the first embodiment, except for the configuration of the apparatus for supplying photosensitive solution.

As shown, the slit coater in accordance with the present embodiment includes a table 240 on which a substrate 200 is mounted, a slit nozzle unit 220 that applies coating solution, for example, photosensitive solution such as photoresist, on the substrate 200, and a driving unit 250 which is installed at both ends of the slit nozzle unit 220 and moves the slit nozzle unit 220 at a constant speed.

The driving unit 250 includes a pair of Z-axial driving apparatuses 251 installed at both ends of the slit nozzle unit 220 and moving the slit nozzle unit 220 up and down, and a pair of Y-axial driving apparatuses 252 that moves the slit nozzle unit 220 back and forth at a constant speed and uniformly sprays the photosensitive solution on the surface of the substrate 200.

An object 200 to be processed such as a glass substrate is mounted on the table 240, and a plurality of pins 241 for lifting up the substrate 200 from the table 240 are installed inside the table 200. The pins 241 are supported by a plate 242 placed under the table 240, thereby mounting or lifting the substrate 200 on or from the table 240 by movement of the plate 242 vertically through action of a driving unit (not shown) such as a motor.

The slit nozzle unit 220 is placed above and across the substrate 200 and includes a nozzle 222 having a slit shape with a length corresponding to a width of the substrate 200, and a head 221 to which the nozzle 222 is mounted.

The nozzle 222 sprays photosensitive solution, moving from one side toward the other side of the substrate 220 through the Y-axial driving apparatus 252, thereby uniformly applying a photosensitive solution on the surface of the substrate 200.

A bubble outlet 260 for removing bubbles within the nozzle 222 is formed at an upper end of a head 221 of the slit nozzle unit 220.

The slit coater having such a structure further includes a supply apparatus for supplying a uniform amount of photosensitive solution in a state that the contamination of the photosensitive solution is minimized and a filtering function is utilized to the maximum extent. The supply apparatus includes a storage tank 271 for storing photosensitive solution, a supply line 276 through which the photosensitive solution stored in the storage tank 271 is supplied to the slit nozzle unit 220, and a control apparatus including a plurality of sensors 295A~295E and a plurality of valves 290 and 280A~280H. The supply apparatus further includes a pumping unit such as a pump 272 for allowing the photosensitive solution to be sprayed by applying constant pressure to the photosensitive solution being supplied from the storage tank 271 to the slit nozzle unit 220.

The storage tank 271 stores coating solution such as a development solution, a color filter or photosensitive solution, such as photoresist that is supplied to the slit nozzle unit 220. The storage tank 271 may be attached to the driving unit 250.

A buffer tank 275 is installed between the pump 272 and the storage tank 271 in order to maintain a constant pressure in the pump 271 and to remove bubbles. A level sensor 290 for measuring the amount of residual photosensitive solution is attached to the buffer tank 275.

When the level sensor 290 of the buffer tank 275 detects a shortage of the photosensitive solution, it sends a signal to a control apparatus (not shown). The control apparatus, in turn, sends the signal to an eighth valve 280F to allow clean and dry air to be introduced to the storage tank 271, thereby introducing the photosensitive solution within the storage tank 271 to the buffer tank 275.

Then, when the first and second valves 280A and 280B are opened and the sixth, third and fifth valves 280F, 280C and 280E are closed, the pump 272 draws the photosensitive solution in the buffer tank 275 to the pump 272.

A filter 270 is installed between the buffer tank 275 and the pump 272, and a speed at which the photosensitive solution passes through the filter 270 is set to be as slow as possible within a range of 0.1 cc/s~1.0 cc/s in order to improve efficiency of the filter 270. Because the filter 270 is installed between the buffer tank 275 and the pump 272, impurities may be more effectively prevented from being introduced to the pump 272 as compared to the case where the filter 270 is installed between the buffer tank 275 and the storage tank 271.

Because the filter 270 is disposed downstream of the buffer tank 275 and the buffer tank 275 does not have an air passage (which exists in the first embodiment), contamination and gelling of the photosensitive solution may be more effectively avoided.

When the pump 272 completes the intake operation, positive pressure is applied to the pump 272 by the storage tank 271. To release the pressure, the eighth valve 280H is opened so that the interior of the storage tank 271 is in an atmospheric state. Then, the first valve 280A and the second valve 280B are closed.

If the positive pressure of the pump 272 is not released and bubbles within the pump 272 and the filter 270 are to be removed, when the first, second and third valves 280A, 280B and 280C are closed, the fifth, sixth and seventh valves 280E, 280F and 280G are opened for a predetermined period of time (for about 1 seconds~10 seconds). Because the seventh valve 280G is connected to a drain, the positive pressure of the pump 272 is released and, simultaneously, the bubbles within the pump 272 and the filter 270 are removed.

If the valves 280E~280G are opened for an excessively long period of time, low pressure is applied to the interior of the pump 272 by potential energy because the drain is commonly placed at a lower position than the pump 272, which may cause introduction of bubbles into the pump 272 and the filter 270. If the pump 272 and the filter 270 are filled with bubbles, variations in the pump discharge amount may be caused resulting in defects.

Therefore, a discharge buffer tank (not shown) is mounted to the drain at the same elevations as the pump 272, and a drain of the discharge buffer tank is closed to thereby release the low pressure of the pump 272.

In such a manner, the internal pressure, namely, the intake amount may be always constantly maintained. Thus, the pump discharge amount is affected only by pump performance regardless of a line and ambient conditions.

The discharge of the photosensitive solution from the nozzle 222 is performed in a state where the third valve 280C is opened and the rest of the valves are closed during discharge operation of the pump 272.

Also, bubble discharge from the nozzle 220 may be performed by the pump 272 as in the aforementioned first embodiment, but the bubbles may be more quickly and conveniently discharged if clean and dry air is injected into the storage tank 271 in a state that the first, second, third and fourth valves 280A, 280B, 280C and 280D are opened.

In addition, the supply line 276, the pump 272 and the slit nozzle 222 are washed by filling the storage tank 271 with washing solution and then pressurizing with clean and dry air when the seventh valve 280G is closed and the rest of the valves are opened.

Also, supplying photosensitive solution to the nozzle 222 after the washing is performed in the same configuration as washing.

Accordingly, the bubble discharging process for the nozzle 222, the washing process for the pump 272 and the nozzle 222, and a process for filling photosensitive solution in the nozzle 222 after the washing may be performed more easily and quickly.

Unlike the first embodiment, the buffer tank 275 in accordance with the present embodiment has no air passage, and the storage tank 271 is pressurized by directly injecting air or nitrogen thereto, so that the washing and the photosensitive solution supplying process may be more easily and quickly performed. In the apparatus for supplying photosensitive solution in accordance with the first embodiment, because an air passage is installed at a buffer tank, washing solution or photosensitive solution is discharged to the air passage of the buffer tank when a storage tank is pressurized directly by the air and nitrogen. In the apparatus in accordance with the first embodiment, direct pressurization using air and nitrogen cannot be used, and the washing and supplying of the photosensitive solution can be performed only by a pump. Thus, it takes a long to perform such operations and convenience of the operation is degraded.

Although not shown in the drawing, a unit for regulating the pressure of the clean and dray air, such as a vacuum regulator may be used in addition to or in place of a general pressure regulator. If the vacuum automatically and separately regulates the pressure for normally discharging photosensitive solution through the nozzle 222, the pressure for washing, and the pressure for discharging bubbles of the nozzle 222, the efficiency may be greatly improved.

Pressure sensors 295A~295E are respectively installed at the storage tank 271, the buffer tank 275, the pump 272, and the slit nozzle unit 220. When a reference pressure value is set the discharge of the photosensitive solution is made based on the reference pressure value, so that the degree of coating may be visualized and the precision of coating through feedback control may be improved.

The first pressure sensor 295A checks the pressure of the storage tank 271 to thereby check the pressure at the time of supplying photosensitive solution to the pump 272, check the pressure at the time of changing the storage tank pressure to atmospheric pressure, and check the pressure of the atmospheric state, thereby improving precision of photosensitive solution transfer to the pump 272, controlling a transfer speed of the photosensitive solution and thusly improving efficiency of the filter 270.

Also, the second pressure sensor 295B monitors the internal pressure of the pump 272 and compares the pressures for intake, stoppage, and discharge to a predetermined reference value. The second pressure sensor 295B also enables feedback control to be performed through a control apparatus based on the comparison result, thereby improving discharge precision and sensing beforehand possibilities of defect-occurrence.

Also, the third pressure sensor 295C and the fourth pressure sensor 295D monitor discharge pressure of the nozzle 222. In the present embodiment, two pressure sensors 295C and 295D are used for monitoring discharge pressure of the nozzle 222, but the present invention is not limited thereby and only one pressure sensor may be used. In particular, one pressure sensor may be installed at one side of the slit nozzle unit 220.

In the present embodiment, by installing the pressure sensors 295C and 295D at both sides of the slit nozzle unit 220, the sensors 295C and 295D can monitor the pressure both when the nozzle 222 does not perform the discharge operation and when the discharging operation is performed. Particularly, blockage of the nozzle 222, variations in the pump discharge amount, changes in the amount of photosensitive solution within the nozzle 222 due to a capillary phenomenon can be detected. If a detected value is different from a predetermined reference value, feedback control is performed through a control apparatus. Also, if compensation by the feedback control is not made and there is a possibility of defect-occurrence during a process, a user may be notified of those results.

By monitoring the pressure of the buffer tank 275, the fifth pressure sensor 295E can improve the precision when the photosensitive solution is supplied.

As described above, the slit coater having an apparatus for supplying coating solution may apply a uniform amount of photosensitive solution onto a surface of a large substrate where contamination of the photosensitive solution is minimized and a filtering function is utilized as much as possible, thereby improving productivity.

Also, the present invention may improve the operability, ease, and convenience of a washing process and a subsequent process of injecting photosensitive solution to a slit nozzle after the washing process.

Also, because the present invention provides a pump or a unit for detecting pressure of the nozzle so as to monitor and control a discharge state of the photosensitive solution, productivity and efficiency may be improved.

As the present invention may be embodied in several forms without departing from the spirit or essential characteristics thereof, it should also be understood that the above-described embodiments are not limited by any of the details of the foregoing description, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A slit coater comprising:
a table on which an object to be processed is mounted;
a slit nozzle unit configured to apply a coating solution onto a surface of the object; and
a coating solution supply apparatus including a storage tank configured to store the coating solution, a pump that supplies the coating solution stored in the storage tank to the slit nozzle unit through a first valve, a sealed buffer tank in fluid communication with the pump and the storage tank, a second valve placed between the buffer tank and the slit nozzle unit, a drain placed between the second valve and the buffer tank and a third valve placed between the drain and the buffer tank,
wherein the supply apparatus is configured to substantially uniformly maintain pump pressure and to remove air bubbles from the coating solution and
wherein air bubbles are removed through the drain in a state that the second valve or the third valve is opened and air is injected into the storage tank.

2. The slit coater of claim 1, wherein the table and the slit nozzle unit are configured to move relative to one another.

3. The slit coater of claim 1, wherein the coating solution comprises one of a photosensitive solution, a development solution, or a color filter.

4. The slit coater of claim 1, wherein the slit nozzle unit comprises:
a nozzle having a slit and having a length longer than its width; and
a head to which nozzle is mounted.

5. The slit coater of claim 1 further comprising:
a pressure sensor that monitors the pressure of the pump;
a fourth valve in a line coupling the pump to the buffer tank that opens to release a rise in pressure in the pump beyond a predetermined pressure limit.

6. The slit coater of claim 5 further comprising:
a filter in fluid communication with the sealed buffer tank and the pump, wherein the filter substantially removes impurities introduced to the pump.

7. The slit coater of claim 6 further comprising:
a line coupling the storage tank and the buffer tank and a fifth valve in the line.

8. The slit coater of claim 7 further comprising:
a line coupling the pump-buffer tank and the filter and a sixth valve in the line.

9. The slit coater of claim 8 further comprising:
a line coupling the pump and the slit nozzle unit buffer tank and a seventh valve in the line.

10. The slit coater of claim 1, wherein the sealed buffer tank substantially prevents the coating solution from being contaminated from ambient surroundings.

11. The slit coater of claim 1 further comprising:
a level sensor configured to measure an amount of residual coating solution in the buffer tank.

12. The slit coater of claim 1 further comprising:
a line coupling the buffer tank and the slit nozzle unit;
the second valve in the line; and the drain in the line between the second valve and the buffer tank.

13. The slit coater of claim 1 further comprising:
a line coupling the buffer tank and the slit nozzle unit:
the first valve in the line;
the pump in the line between the first valve and the buffer tank: and
a filter in the line between the pump and the buffer tank.

14. The slit coater of claim 13 further comprising:
a fourth valve in the line between the pump and the filter.

15. The slit coater of claim 14 further comprising:
fifth valve in the line between the filter and the buffer tank.

16. The slit coater of claim 1 further comprising:
a pressure sensor configured to monitor the internal pressure of the pump.

17. The slit coater of claim 16, wherein the pressure sensor is further configured to compare the intake pressure, the idle pressure, and the discharge pressure with a reference value and to provide the comparison result to a control unit.

* * * * *